(12) United States Patent
Nagasaka et al.

(10) Patent No.: US 7,350,988 B2
(45) Date of Patent: Apr. 1, 2008

(54) OPTICAL MODULE AND METHOD OF MANUFACTURING THE SAME

(75) Inventors: Kimio Nagasaka, Hokuto (JP); Masayuki Kikushima, Ina (JP)

(73) Assignee: Seiko Epson Corporation, Tokyo (JP)

(*) Notice: Subject to any disclaimer, the term of this patent is extended or adjusted under 35 U.S.C. 154(b) by 7 days.

(21) Appl. No.: 11/599,410

(22) Filed: Nov. 15, 2006

(65) Prior Publication Data

US 2007/0114553 A1 May 24, 2007

(30) Foreign Application Priority Data

Nov. 18, 2005 (JP) ............................ 2005-334304

(51) Int. Cl.
*G02B 6/36* (2006.01)
*H01L 23/48* (2006.01)
(52) U.S. Cl. ..................... 385/94; 257/737; 257/738
(58) Field of Classification Search ................. 385/94, 385/92
See application file for complete search history.

(56) References Cited

U.S. PATENT DOCUMENTS

| 6,232,211 | B1* | 5/2001 | Tsukahara ................ 438/612 |
| 6,485,993 | B2* | 11/2002 | Trezza et al. ................ 438/22 |
| 6,588,949 | B1 | 7/2003 | Zhou |
| 6,932,522 | B2 | 8/2005 | Zhou |
| 2004/0022502 | A1 | 2/2004 | Zhou |
| 2005/0058399 | A1* | 3/2005 | Nishizawa et al. ........... 385/39 |
| 2006/0261364 | A1* | 11/2006 | Suehiro et al. ............. 257/100 |

FOREIGN PATENT DOCUMENTS

| JP | U 05-29156 | 4/1993 |
| JP | A 09-172102 | 6/1997 |
| JP | A 11-265955 | 9/1999 |
| JP | A 2000-22012 | 1/2000 |
| JP | A 2001-257533 | 9/2001 |
| JP | A 2001-274653 | 10/2001 |
| JP | A 2002-534813 | 10/2002 |

OTHER PUBLICATIONS

U.S. Appl. No. 11/599,411, Kimio Nagasaka et al., filed Nov. 15, 2006.

* cited by examiner

*Primary Examiner*—Michelle Connelly-Cushwa
*Assistant Examiner*—Kajli Prince
(74) *Attorney, Agent, or Firm*—Oliff & Berridge, PLC

(57) ABSTRACT

An optical module including: a housing formed of ceramics and having a base portion and a frame portion provided on the base portion; an optical element provided inside the frame portion; a cover member for the housing, the cover member being formed of a transparent substrate; and a connector with a lens provided so that the lens is disposed above the housing. The optical module may include a sealing member for bonding the housing and the cover member.

5 Claims, 8 Drawing Sheets

OPTICAL MODULE AND METHOD OF MANUFACTURING THE SAME

Japanese Patent Application No. 2005-334304, filed on Nov. 18, 2005, is hereby incorporated by reference in its entirety.

BACKGROUND OF THE INVENTION

The present invention relates to an optical module and a method of manufacturing the same.

An optical element such as a light-emitting element or a light-receiving element may be damaged by the external environment such as dust or moisture to deteriorate in performance. In order to prevent such a deterioration in performance, a method of sealing an optical element in a package has been developed. For example, JP-T-2002-534813 discloses a sealing method in which an adhesive layer and a metal layer are formed to cover a photon device on a substrate.

In order to obtain excellent coupling efficiency when optically coupling an optical element and another device such as an optical fiber, it is necessary to accurately adjust the position of the optical element in the optical axis direction. However when the structure of the package which accommodates the optical element is not precisely formed, it is difficult to accurately adjust the position of the optical element, for example.

SUMMARY

According to a first aspect of the invention, there is provided an optical module comprising:

a housing formed of ceramics and having a base portion and a frame portion provided on the base portion;

an optical element provided inside the frame portion;

a cover member for the housing, the cover member being formed of a transparent substrate; and a connector with a lens provided so that the lens is disposed above the housing.

According to a second aspect of the invention, there is provided a method of manufacturing an optical module including an optical element, the method comprising:

(a) providing a housing formed of ceramics and having a base portion and a frame portion provided on the base portion;

(b) providing the optical element above the base portion of the housing;

(c) providing a sealing member for bonding the housing and a cover member on an upper surface of the frame portion;

(d) bonding the frame portion of the housing and the cover member formed of a transparent substrate; and (e) providing a connector with a lens so that the lens is disposed above the transparent substrate.

DETAILED DESCRIPTION OF THE EMBODIMENT

Figure 1:
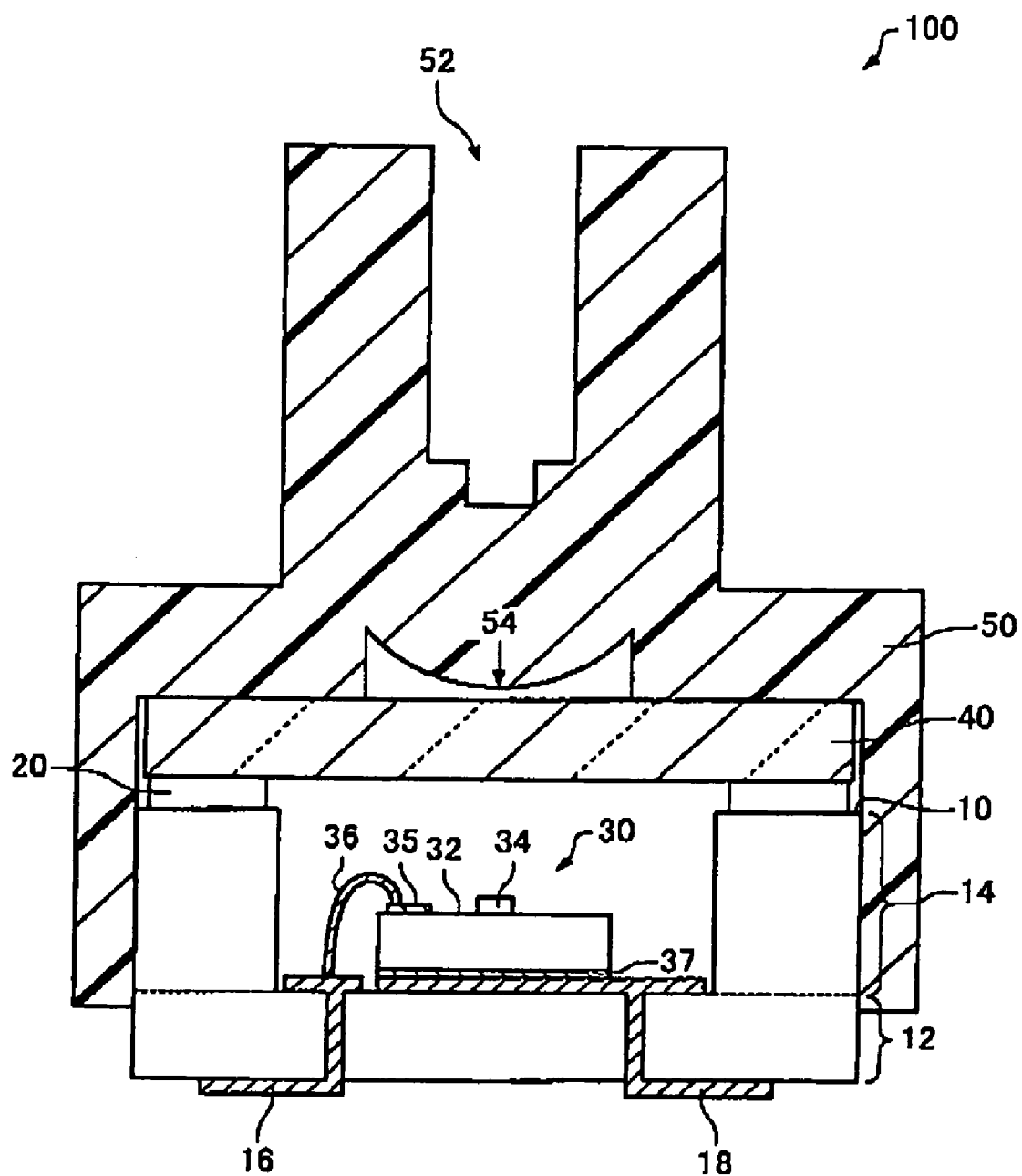
FIG. 1 is a cross-sectional view schematically showing an optical module according to one embodiment of the invention.

The invention may provide an optical module and a method of manufacturing the same in which an optical element can be sealed by simple steps and the position of the optical element in the optical axis direction can be accurately adjusted.

According to one embodiment of the invention, there is provided an optical module comprising:

a housing formed of ceramics and having a base portion and a frame portion provided on the base portion;

an optical element provided inside the frame portion;

a cover member for the housing, the cover member being formed of a transparent substrate; and a connector with a lens provided so that the lens is disposed above the housing.

The optical module according to this embodiment enables the optical element to be sealed by simple steps and the position of the optical element in the optical axis direction to be accurately adjusted.

The optical module may further comprise a sealing member provided on an upper surface of the frame portion and used for bonding the housing and the cover member, wherein the transparent substrate is formed of a glass substrate; and wherein the sealing member is formed of low-melting-point glass.

The optical module may further comprise a spacer provided above the base portion and inside the housing, wherein the optical element is provided above the spacer.

In this optical module, the spacer may be formed of a conductive material.

The optical module may further comprise a conductive layer formed on an upper surface of the base portion, wherein the spacer is formed of a wire provided on an upper surface of the conductive layer and bonded to the conductive layer in two locations.

In this optical module, the optical element may include a substrate, an optical portion provided on the substrate, and a first electrode and a second electrode for driving the optical element; and the first electrode may be formed on a surface of the substrate on a side of the spacer.

According to one embodiment of the invention, there is provided a method of manufacturing an optical module including an optical element, the method comprising:

(a) providing a housing formed of ceramics and having a base portion and a frame portion provided on the base portion;

(b) providing the optical element above the base portion of the housing;

(c) providing a scaling member for bonding the housing and a cover member on an upper surface of the frame portion;

(d) bonding the frame portion of the housing and the cover member formed of a transparent substrate; and (e) providing a connector with a lens so that the lens is disposed above the transparent substrate.

In this method of manufacturing an optical module, the step (a) may include integrating a frame member forming the frame portion of the housing and a sheet member forming the base portion of the housing by firing.

The method of manufacturing an optical module may further comprise before the step (b):

providing a spacer on the base portion of the housing; and pressing the spacer to plastically deform the spacer, wherein the step (b) includes providing the optical element above the base portion of the housing by bonding the optical element and the spacer.

Some embodiments of the invention will be described below, with reference to the drawings.

1. Optical Module

The structure of an optical module according to this embodiment is described below. FIG. 1 is a cross-sectional view schematically showing the optical module.

An optical module 100 includes a housing 10, a sealing member 20; an optical element 30, a cover member 40, and a connector 50 with a lens. The housing 10 includes a base portion 12 and a frame portion 14 provided on the base portion 12. The base portion 12 and the frame portion 14 are formed of ceramics. The housing 10 further includes a first interconnect 16 and a second interconnect 18. The first interconnect 16 and the second interconnect 18 are provided, running from the upper surface of the base portion 12 to the bottom surface thereof, each through a dedicated hole. The second interconnect 18 may be formed on the upper surface of the base portion 12 in a region in which an optical element is bonded. The sealing member 20 is formed on the upper surface of the frame portion 14, and has a rectangular frame shape, for example. The sealing member 20 is provided to bond a cover member 40 and the housing 10.

The optical element 30 includes a substrate 32 and an optical portion 34 provided on the substrate 32. The optical element 30 may be a light-emitting element or a light-receiving element. The optical portion 34 is a portion which emits or receives light. The optical portion 34 of the light-emitting element may be a resonator of a surface-emitting semiconductor laser, for example. The optical portion 34 of the light-receiving element may be a light-absorption region, for example. The optical element further includes a first electrode 37 and a second electrode for driving the optical element 30. The first electrode 37 is formed on the surface of the substrate 32 on which the second interconnect 18 is formed. The second electrode 35 is formed on the upper surface of the substrate 32. A wire 36 electrically connects the second electrode 35 and the first interconnect 16.

The cover member 40 is provided on the sealing member 20 to cover an opening surrounded by the frame portion 14 of the housing 10. The cover member 40 may be formed of a transparent substrate which transmits light emitted or received by the optical element 30. The cover member 40 may be formed of a glass substrate or the like.

The connector 50 with a lens includes a lens portion 52 and a sleeve 54 and is integrally formed, as shown in FIG. 1. The connector 50 with a lens is formed of a resin, for example. A ferrule or the like is inserted into the sleeve 52. The lens portion 54 is provided over the optical element 30, and condenses light emitted from the optical portion 34 or light entering from the outside. The connector 50 with a lens is provided to surround the frame portion 14.

The optical module 100 according to this embodiment enables the optical element 30 to be sealed in an airtight manner. The distance between the optical portion 34 of the optical element 30 and the lens portion 52 can be adjusted by adjusting the height of the fame portion 14. As a result, coupling efficiency of light emitted from or received by the optical element 30 with the outside can be improved.

2. Method of Manufacturing Optical Module

A method of manufacturing an optical module according to this embodiment is described below. FIGS. 2 to 5 are cross-sectional views showing the method of manufacturing an optical module.

Figure 2:
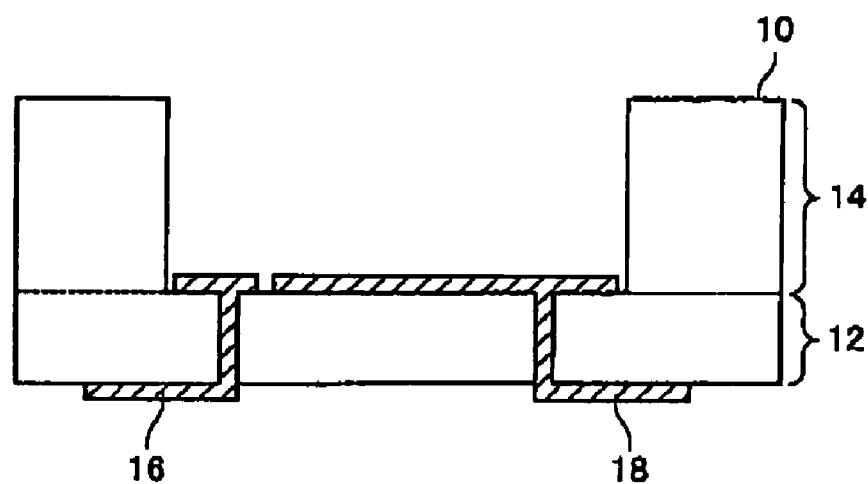
FIG. 2 is a cross-sectional view schematically showing a method of manufacturing an optical module according to one embodiment of the invention.

As shown in FIG. 2, the housing 10 is provided. A sheet member constituting the base portion 12 and a frame member constituting the frame portion 14 may be formed of a single layer or a stacked layer of a green sheet, which is unsintered ceramics containing alumina, for example. The frame member constituting the frame portion 14 is obtained by forming a hole in a green sheet. The green sheet may be processed to have a desired shape using a punching die, a punching machine, or the like. The size of the housing 10 can be adjusted by adjusting the number of green sheets used for the base portion 12 and the frame portion 14. An interconnect may be formed on the surface of each green sheet by printing or the like. The sheet member constituting the base portion 12 and the frame member constituting the frame portion 14 may be stacked and integrated by firing to form the housing 10. The upper surface of the frame portion 14 of the housing 10 may be subjected to surface treatment in order to ensure sufficient adhesion between the housing 10 and the sealing member 20 (described later).

The first interconnect 16 and the second interconnect 18 are formed by forming holes in the sheet member constituting the base portion 12, and providing a conductive material in the holes.

Figure 3:
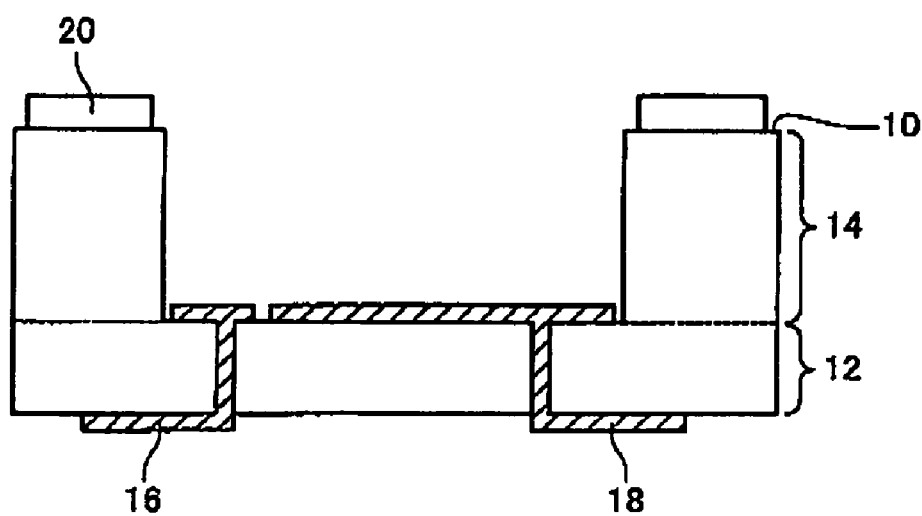
FIG. 3 is a cross-sectional view schematically showing a method of manufacturing an optical module according to one embodiment of the invention.

As shown in FIG. 3, the sealing member 20 is provided on the upper surface of the frame portion 14. The sealing member 20 is provided to bond the cover member 40 (described later) and the housing 10. Any material may be used for the sealing member 20 insofar as the material can bond the housing 10 and the cover member 40. The sealing member 20 may be formed of a thermoplastic insulating material or a metal material. For example, the sealing member may be formed of a preform of low-melting-point glass.

Figure 4:
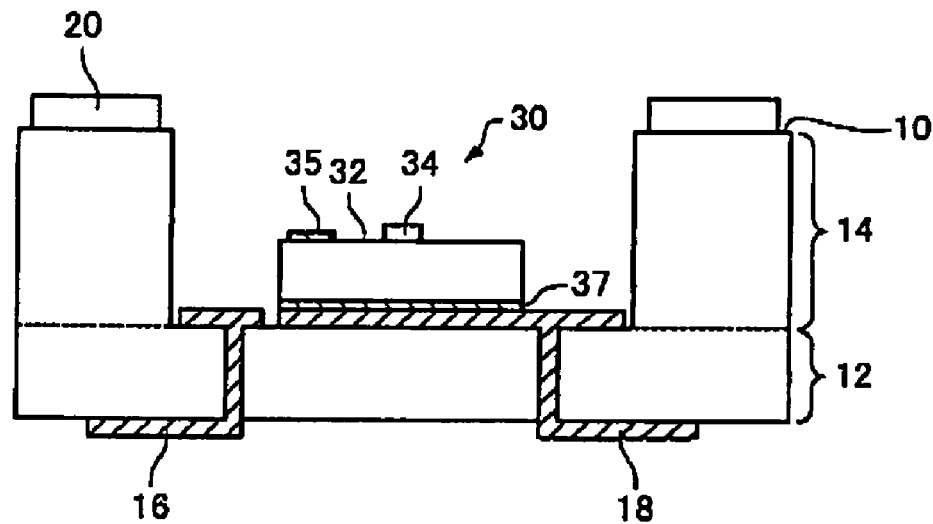
FIG. 4 is a cross-sectional view schematically showing a method of manufacturing an optical module according to one embodiment of the invention.

As shown in FIG. 4, the optical element 30 and the housing 10 are bonded. Specifically, the optical element 30 is bonded to the second interconnect 18. After applying a bonding member 24, the optical element 30 is disposed over the bonding member 24, and die-bonded while applying an appropriate load downward. As the bonding member 24, silver paste may be used, for example.

After the silver paste as the bonding member 24 has been hardened, a wire 36 and a wire 38 are bonded by a known method. The wire 36 electrically connects an electrode formed on the substrate 32 and the first interconnect 16. The wire 38 electrically connects an electrode formed on the substrate 32 and the second interconnect 18.

Figure 5:
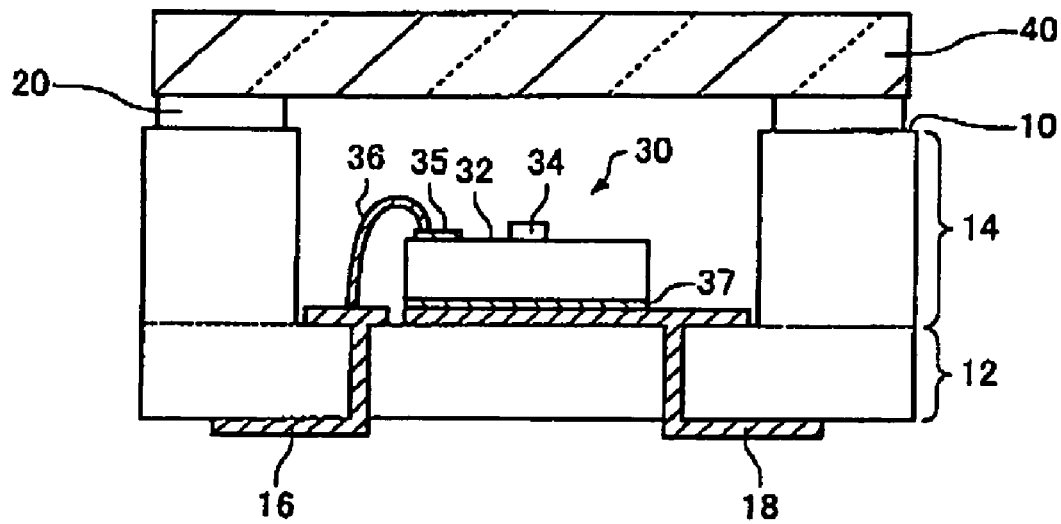
FIG. 5 is a cross-sectional view schematically showing a method of manufacturing an optical module according to one embodiment of the invention.

As shown in FIG. 5, the cover member 40 and the housing 10 are bonded through the sealing member 20. The sealing member 20 is heated while pressing the cover member 40 in the direction of the base portion 12 (downward). The sealing member 20 may be heated by applying a laser beam from above, for example. When using a glass substrate as the cover member 40, adhesion between the sealing member 20 and the cover member 40 can be improved by using low-melting-point glass as the material for the sealing member 20.

As shown in FIG. 1, the connector 50 with a lens is secured to the housing 10. The connector 50 with a lens may be formed of a resin. Specifically, the connector 50 with a lens may be secured to the housing by pressing the uncured connector 50 with a lens to the cover member 40 and the housing 10, and curing the connector 50 to cause the connector 50 to adhere to the housing 10. Securing the connector 50 with a lens to the housing 10 by the above-described method can minimize the effects of cure shrinkage of an adhesive which occurs when securing the connector 50 with a lens to the housing 10 using an adhesive.

The optical module 100 can be thus manufactured. Accordingly, the distance between the optical portion 34 of the optical element 30 and the lens portion 52 can be accurately adjusted, and the coupling efficiency of light emitted from or received by the optical element 30 with the outside can be improved.

3. Modification 3.1 First Modification

Figure 6:
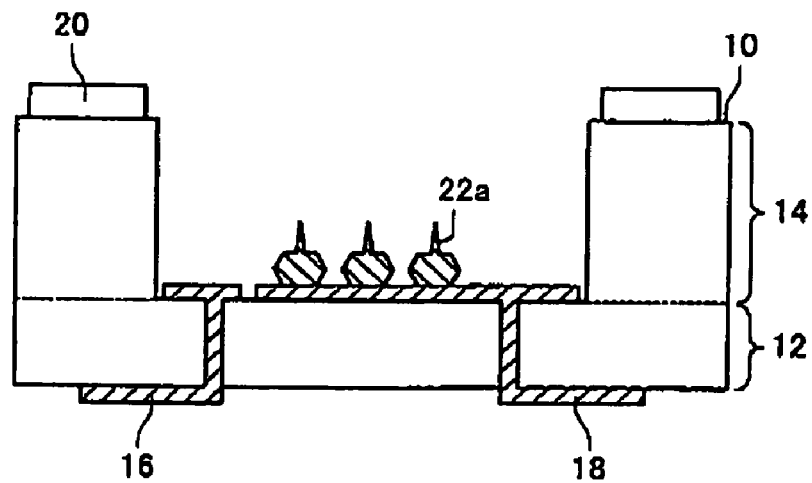
FIG. 6 is a cross-sectional view schematically showing a method of manufacturing an optical module according to a first modification.
Figure 7:
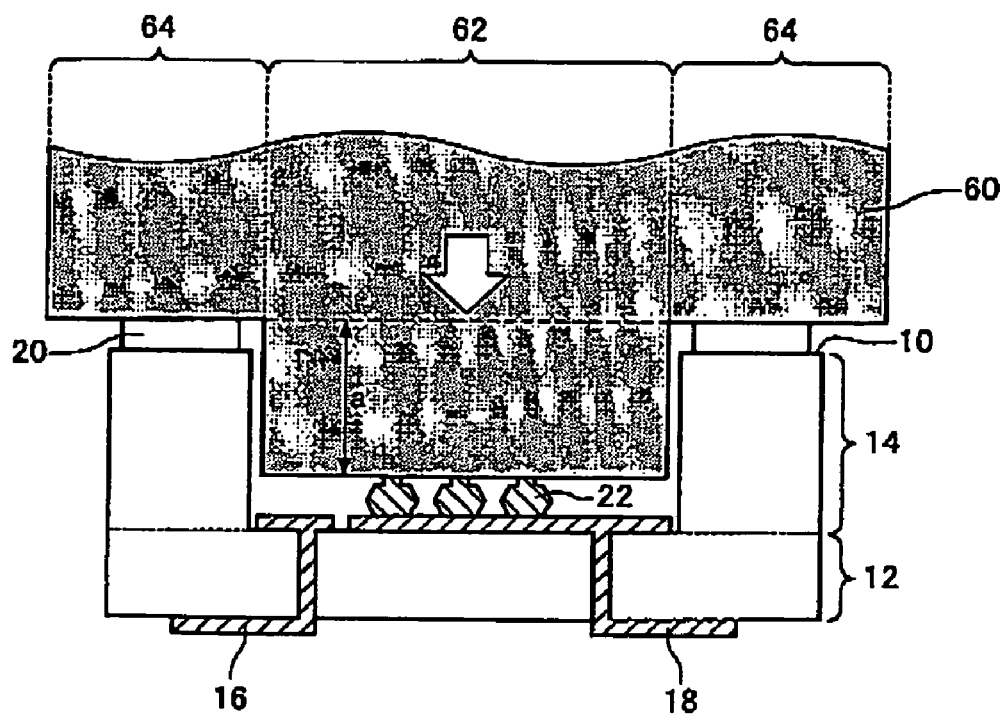
FIG. 7 is a cross-sectional view schematically showing a method of manufacturing an optical module according to the first modification.
Figure 8:
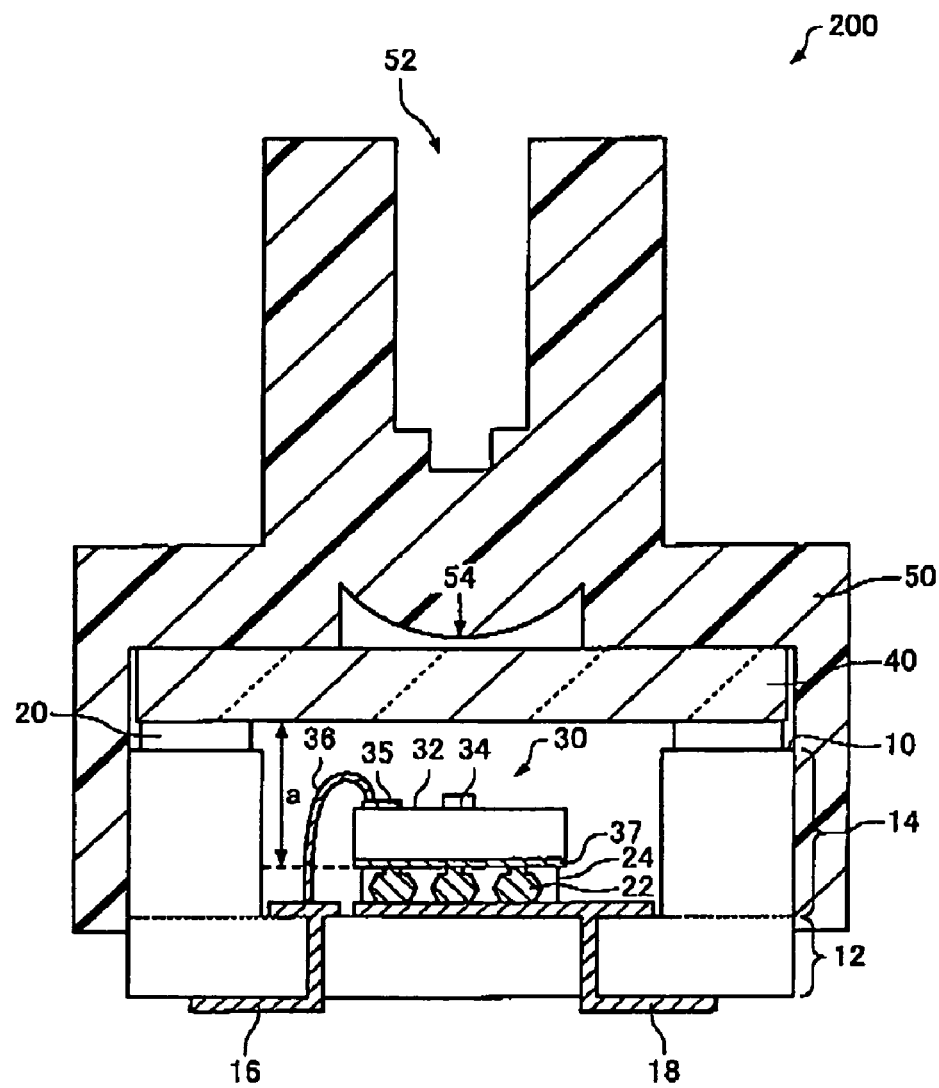
FIG. 8 is a cross-sectional view schematically showing an optical module according to the first modification.

An optical module 200 according to a first modification is described below. FIGS. 6 and 7 are cross-sectional views schematically showing a method of manufacturing the optical module according to the first modification. FIG. 8 is a cross-sectional view schematically showing the optical module according to the first modification.

The optical module 200 according to the first modification differs from the optical module 100 according to this embodiment in that the optical module 200 further includes spacers 22. The optical module 200 is manufactured as follows.

As shown in FIG. 6, spacers 22a are formed on the base portion 12 inside the housing after forming the sealing member 20 on the upper surface of the housing 10. The spacer 22a has a protrusion which protrudes upward. The spacer 22a may be formed of a plastically deformable material, such as a ball bump. The ball bump is formed by first bonding a ball formed at the tip of a capillary to the housing 10 using a wire bonder, and cutting a wire protruding from the ball. The ball bump is first bonded only to the second interconnect 18 formed on the base portion 12. It is preferred that the spacer 22a be formed of a metal material such as gold. The ball bump is formed in a region where the optical element 30 is formed. When the bottom of the optical element 30 has a size of 0.3 mm×0.3 mm, 3×3 ball bumps with a diameter of 0.1 mm are formed, for example.

As shown in FIG. 7, the spacers 22a are plastically deformed by pressing using a height adjustment jig 60. The height adjustment jig 60 includes a first portion 62 facing the spacers 22a and a second portion 64 facing the frame portion 14, and has a convex shape, as shown in FIG. 7. The upper surface of the first portion 62 is positioned higher than the upper surface of the second portion 64. The height adjustment jig 60 is provided so that the difference in height between the upper surface of the first portion 62 and the upper surface of the second portion 64 is an arbitrary distance "a". Any material may be used for the height adjustment jig 60 insofar as the material is harder than the sealing member 20 and the spacer 22a.

Specifically, the spacers 22a and the sealing member 20 are pressed using the height adjustment jig 60 in the direction indicated by the arrow shown in FIG. 7. In more detail, the first portion 62 presses the spacers 22a and the second portion 64 presses the sealing member 20. This allows the spacers 22a to be crushed and plastically deformed, whereby the spacers 22 are formed. As a result, the difference in height between the spacers 22 and the sealing member 20 can be adjusted to the distance "a". Specifically, the height adjustment jig 60 is used so that the first portion 62 presses the spacers 22a and the second portion 64 presses the upper surface of the sealing member 20. This may allow the sealing member 20 to be crushed and plastically deformed. If the sealing member 20 is significantly harder than the spacer 22a, the sealing member 20 is not plastically deformed to limit the pressure applied to the spacer 22a, thereby preventing the spacer 22a from being excessively plastically deformed.

The bonding member 24 is applied to fill the gap between the spacers 22 using above method to bond the optical element 30 to the spacers 22. The subsequent steps are the same as those of the method of manufacturing the optical module 100, and further explanation is omitted.

In the method of manufacturing the optical module 200 according to the first modification, the spacers 22a are crushed using the height adjustment jig 60, and the optical element 30 is disposed on the crushed spacers 22a. This allows the difference in height between the optical element 30 and the cover member 40 to be adjusted to the distance "a". Since the distance between the optical element 30 and the lens portion 52 can be accurately adjusted by precisely adjusting the distance between the optical element 30 and the cover member 40, the optical path can be highly controlled. As a result, the optical coupling efficiency between the optical element 30 and an external device such as an optical fiber can be improved.

In the method of manufacturing the optical module 200 according to the first modification, since the spacer 22a has a protrusion, the spacer 22a is easily plastically deformed by the height adjustment jig 60. As a result, the spacer 22 with an appropriate height can be formed. Since the spacer 22a is generally formed of a conductive material having a high thermal conductivity, the spacer 22 can exhibit excellent heat dissipation properties. The first electrode 37 is provided on the side (underside) of the spacer 22. When the electrode is provided on the underside of the optical element 30 and the spacer 22a is formed of a conductive material, it may be unnecessary to wire-bond the upper surface of the optical element 30 and the second interconnect 18 since the second interconnect 18 can be electrically connected with the optical element 30.

The spacers 22a and the sealing member 20 can be pressed simultaneously using the height adjustment jig 60 as shown in FIG. 7. This allows the difference in height between the upper surface of the sealing member 20 and the upper surfaces of the spacers 22 to be accurately adjusted, whereby the distance between the optical element 30 and the lens portion 52 can be accurately adjusted, even though the height of the base portion 12 of the housing 10 cannot be finely adjusted.

The configuration and the manufacturing steps of the optical module 200 other than those mentioned above are the same as the configuration and the manufacturing steps of the optical module 100, and further explanation is omitted.

In the method of manufacturing the optical module according to the first modification, the spacers 22a are plastically deformed after providing the sealing member 20. Alternatively, the spacers 22a may be plastically deformed before providing the scaling member 20. In this case, the first portion of the height adjustment jig 60 presses the spacers 22a, and the second portion 64 presses the upper surface of the frame portion 14. As a result, the frame portion 14 can limit the pressure applied to the spacers 22a, thereby preventing the spacers 22a from being excessively plastically deformed.

3.2 Second Modification

Figure 9:
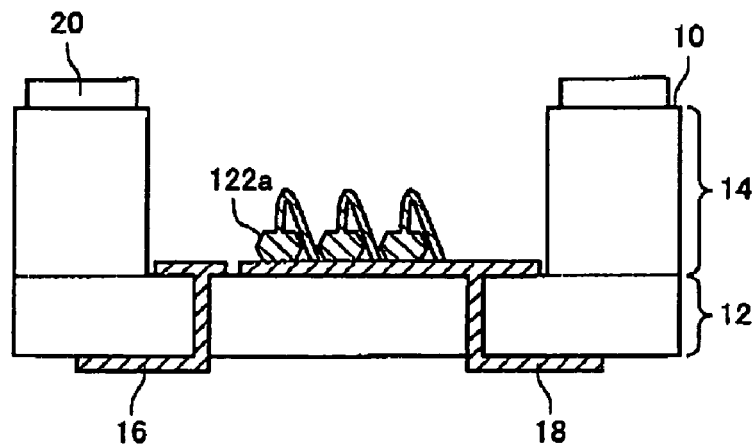
FIG. 9 is a cross-sectional view schematically showing a method of manufacturing an optical module according to a second modification.
Figure 10:
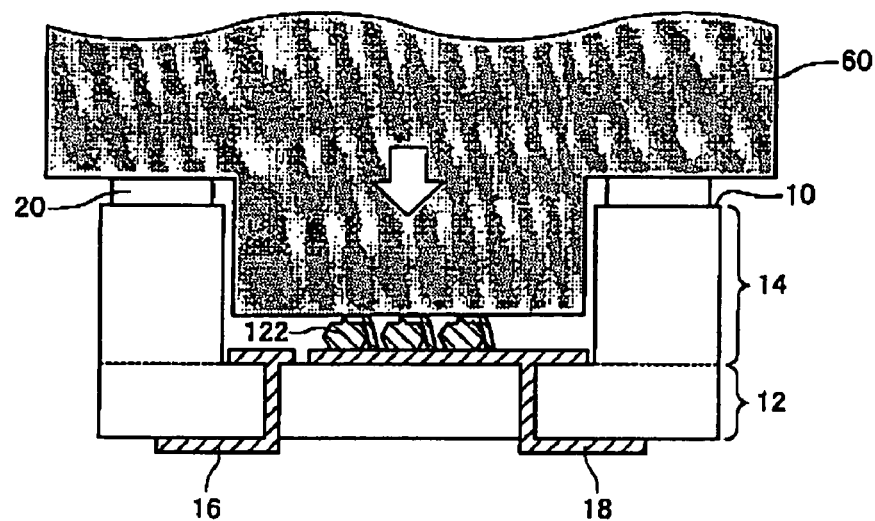
FIG. 10 is a cross-sectional view schematically showing a method of manufacturing an optical module according to the second modification.
Figure 11:
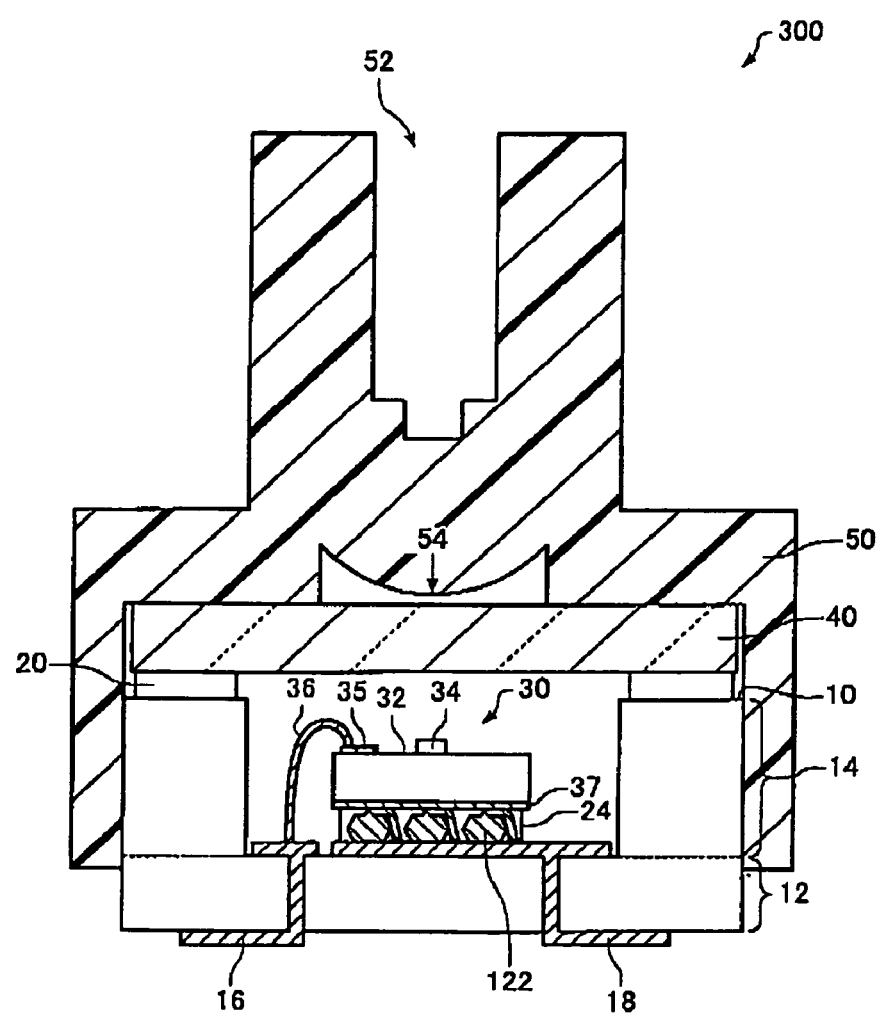
FIG. 11 is a cross-sectional view schematically showing an optical module according to the second modification.

An optical module 300 according to a second modification is described below. FIGS. 9 and 10 are cross-sectional views schematically showing a method of manufacturing the optical module according to the second modification. FIG. 11 is a cross-sectional view schematically showing the optical module according to the second modification. The optical module 300 according to the second modification differs from the optical module according to the first modification in that each spacer 122 is bonded to the second interconnect 18 in two locations.

As shown in FIG. 9, spacers 122a are formed on the base portion 12 inside the housing 10 after forming the sealing member 20 on the housing 10. A ball formed at the tip of a capillary is first-bonded to the second interconnect 18 using a wire bonder, and the other end of the wire is second-bonded to the second interconnect 18, whereby the spacers 122a are formed, as shown in FIG. 8.

As shown in FIG. 10, the spacers 122a are plastically deformed by pressing using the height adjustment jig 60 to form the spacers 122. The cover member 40 and the connector 50 with a lens are provided as described above, whereby the optical module 300 is obtained as shown in FIG. 11. Since each of the spacers 122 is bonded to the second interconnect 18 in two locations, electrical resistance can be decreased, whereby heat dissipation properties can be improved.

The configuration and the manufacturing steps of the optical module 300 other than those mentioned above are the same as the configuration and manufacturing steps of the optical module 200, and further explanation is omitted.

3.3 Third Modification

Figure 12:
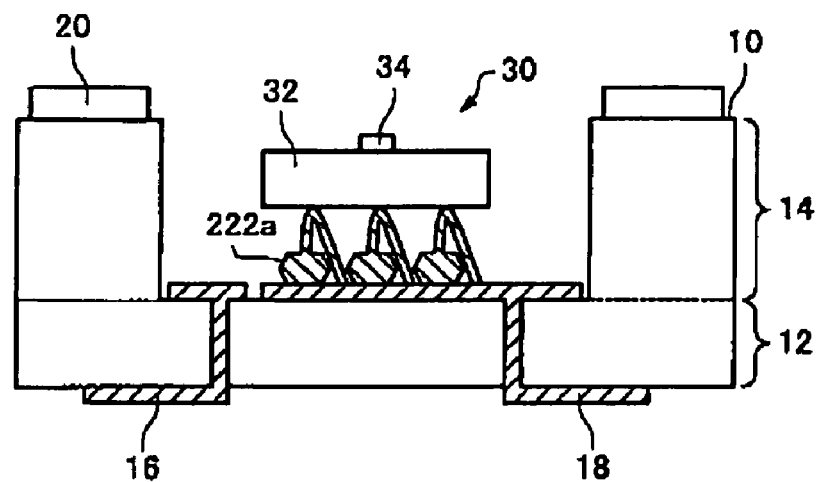
FIG. 12 is a cross-sectional view schematically showing a method of manufacturing an optical module according to a third modification.
Figure 13:
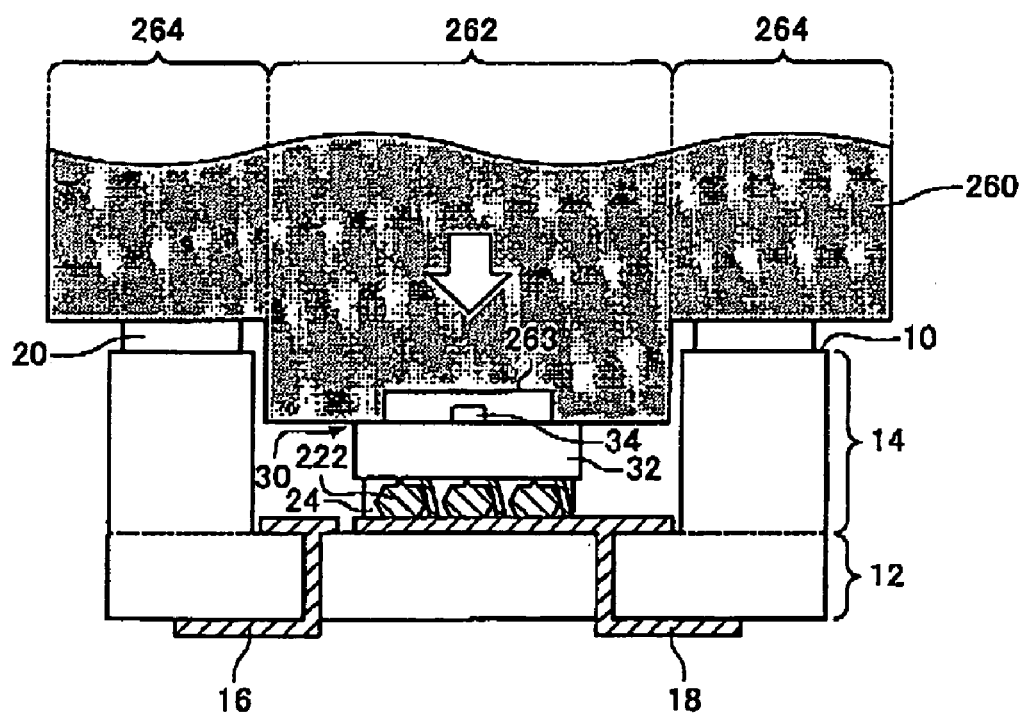
FIG. 13 is a cross-sectional view schematically showing a method of manufacturing an optical module according to the third modification.

A method of manufacturing an optical module according to a third modification is described below. FIGS. 12 and 13 are cross-sectional views showing the method of manufacturing an optical module according to the third modification.

The optical module according to the third modification differs from the optical module 100 according to this embodiment in that the optical module further includes spacers 222. The method of manufacturing the optical module according to the third modification differs from the methods of manufacturing the optical module according to the first and second modifications in that the optical element 30 is disposed on the spacers 222a before pressing using a height adjustment jig 260. The spacer 222a used in the method of manufacturing the optical module according to the third modification is similar to the spacer 122a used in the second modification. The configuration of the spacer 222a, however, is not limited thereto.

After forming the spacers 222a, the optical element 30 is disposed on the spacers 222a, as shown in FIG. 12. It is preferred that the spacers 222a be formed so that the spacers 222a have an equal height to allow the optical element 30 to be disposed thereon horizontally. Before disposing the optical element 30, the bonding member 24 may be applied to the gap between the spacers 222a or on the upper surfaces of the spacers 222a.

The substrate 32 of the optical element 30 and the sealing member 20 are pressed using the height adjustment jig 260. The height adjustment jig 260 has a concave portion 263 in a first portion 262 acing the spacers 222a, as shown in FIG. 13. Specifically, the part of the first portion 262 excluding the concave portion 263 presses the substrate 32 of the optical element 30, and a second portion 264 presses the sealing member 20.

The concave portion 263 is provided at a position where the optical portion 34 can be accommodated in the concave portion 263 during pressing. This allows the optical element 30 to be pressed without damaging the optical portion 34 due to pressing. It is preferred that the concave portion 263 be formed in a region smaller than the substrate 32 in a plan view. It is preferred that the area surrounding the concave portion 263 be flat in the first portion 262. This allows the area surrounding the optical portion 34 of the optical element 30 to be pressed at a uniform pressure. The difference in height between the upper surface of the substrate 32 of the optical element 30 and the upper surface of the sealing member 20 can be accurately adjusted by pressing the optical element 30. This allows the distance between the optical portion 34 and the lens portion 52 to be adjusted without taking the thickness of the substrate 32 into consideration.

The step of disposing the cover member 40 and the subsequent steps are the same as those of the method of manufacturing the optical module according to this embodiment, and further explanation is omitted.

3.4 Fourth Modification

Figure 14:
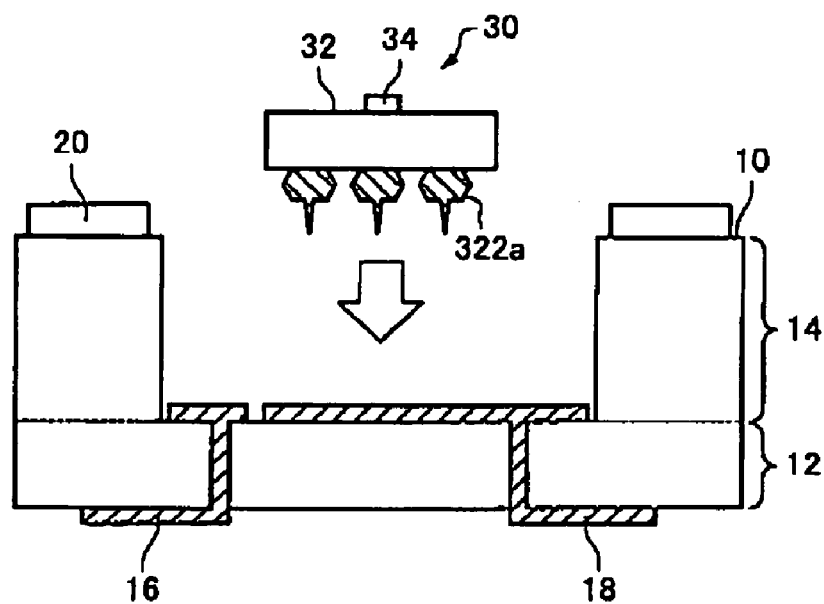
FIG. 14 is a cross-sectional view schematically showing a method of manufacturing an optical module according to a fourth modification.
Figure 15:
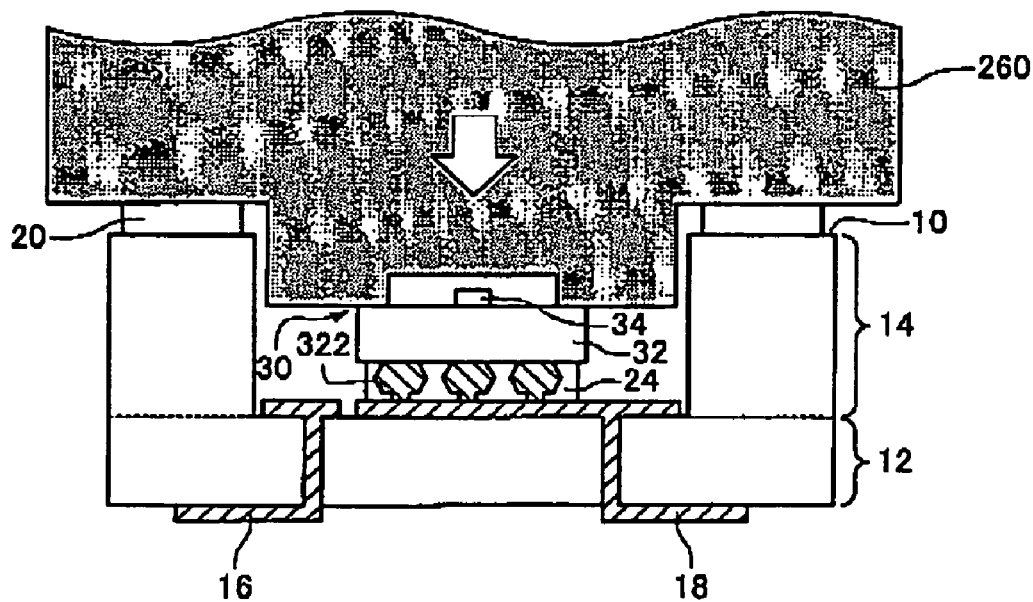
FIG. 15 is a cross-sectional view schematically showing a method of manufacturing an optical module according to the fourth modification.

A method of manufacturing an optical module according to a fourth modification is described below. FIGS. 14 and 15 are cross-sectional views schematically showing the method of manufacturing an optical module according to the fourth modification. The method of manufacturing an optical module according to the fourth modification differs from the method of manufacturing an optical module according to this embodiment in that spacers 322a are formed on the optical element 30 and then disposed on the housing 10.

As shown in FIG. 14, the spacers 322a are formed on the underside of the optical element 30. The spacer 322a is formed by a method similar to the method of forming the spacer 22a according to this embodiment. Specifically, the spacer 322a is formed by first bonding a ball formed at the tip of a capillary to the underside (lower side) of the optical element 30 using a wire bonder, and cutting a wire protruding from the ball. The ball bump is first bonded only to the underside of the substrate 32. An electrode for driving the optical element 30 may be formed on the underside of the substrate 32

Subsequently, the optical element 30 is disposed on the base portion 12 inside the housing 10. After applying the bonding member 24 in the gap between the spacers 322a or on the upper surfaces of the spacers 322a, the optical element 30 is disposed on the second interconnect 18 with the side of the spacer facing downward. The optical element 30 is then pressed using the height adjustment jig 260, and heated to bond the optical element 30 to the housing 10. The configuration of the height adjustment jig 260 according to the third modification is similar to that of the height adjustment jig 260 according to the third modification, and further explanation is omitted.

As described above, forming the spacers 322a on the optical element 30 in advance enables spacers 322 to be disposed at appropriate positions on the optical element 30. The difference in height between the upper surface of the substrate 32 of the optical element 30 and the upper surface of the sealing member 20 can be accurately adjusted by pressing the optical element 30. This allows the distance between the optical portion 34 and the lens portion 52 to be adjusted without taking the thickness of the substrate 32 into consideration.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. An optical module comprising:
   a housing formed of ceramics and having a base portion and a frame portion provided on the base portion;
   a conductive layer provided on the base portion;
   a spacer provided on the conductive layer, the spacer being formed of a conductive material, the spacer having a base and a wire, the base being bonded to the conductive layer, the wire extending from a top of the base and being bonded to the conductive layer;
   an optical element provided on the spacer inside the frame portion;
   a cover member for the housing, the cover member being formed of a transparent substrate; and
   a connector with a lens provided so that the lens is disposed above the housing.

2. The optical module as defined in claim 1, further comprising:
   a sealing member provided on an upper surface of the frame portion and used for bonding the housing and the cover member,
   wherein the transparent substrate is formed of a glass substrate; and
   wherein the sealing member is formed of low-melting-point glass.

3. The optical module as defined in claim 1,
   wherein the optical element includes a substrate, an optical portion provided on the substrate, and a first electrode and a second electrode for driving the optical element; and
   wherein the first electrode is formed on a surface of the substrate on a side of the spacer.

4. A method of manufacturing an optical module including an optical element, the method comprising:
   (a1) providing a housing formed of ceramics and having a base portion and a frame portion provided on the base portion and a conductive layer formed on the base portion;
   (a2) providing a spacer on the conductive layer, the spacer being formed of a conductive material, the spacer having a base and a wire, the base being bonded to the conductive layer, the wire extending from a top of the base and being bonded to the conductive layer;
   (a3) pressing the spacer to be deformed;
   (b) providing the optical element on the spacer;
   (c) providing a sealing member for bonding the housing and a cover member on an upper surface of the frame portion;
   (d) bonding the frame portion of the housing and the cover member formed of a transparent substrate; and
   (e) providing a connector with a lens so that the lens is disposed above the transparent substrate.

5. The method of manufacturing an optical module as defined in claim 4,
   wherein the step (a1) includes integrating a frame member forming the frame portion of the housing and a sheet member forming the base portion of the housing by firing.

* * * * *